(12) United States Patent
Liu et al.

(10) Patent No.: US 11,183,542 B2
(45) Date of Patent: Nov. 23, 2021

(54) DISPLAY PANEL AND METHOD FOR MANUFACTURING DISPLAY PANEL

(71) Applicant: BOE TECHNOLOGY GROUP CO., LTD., Beijing (CN)

(72) Inventors: Li Liu, Beijing (CN); Junbo Wei, Beijing (CN); Pengcheng Lu, Beijing (CN); Shengji Yang, Beijing (CN); Yunlong Li, Beijing (CN); Rongrong Shi, Beijing (CN); Dacheng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/960,573

(22) PCT Filed: Aug. 23, 2019

(86) PCT No.: PCT/CN2019/102311
§ 371 (c)(1),
(2) Date: Jul. 8, 2020

(87) PCT Pub. No.: WO2021/035418
PCT Pub. Date: Mar. 4, 2021

(65) Prior Publication Data
US 2021/0175296 A1    Jun. 10, 2021

(51) Int. Cl.
*H01L 29/08* (2006.01)
*H01L 27/32* (2006.01)
(Continued)

(52) U.S. Cl.
CPC ........ *H01L 27/3218* (2013.01); *H01L 27/322* (2013.01); *H01L 51/5056* (2013.01); *H01L 51/5072* (2013.01); *H01L 51/56* (2013.01)

(58) Field of Classification Search
CPC .............. H01L 27/3218; H01L 27/322; H01L 51/5056; H01L 51/5072
See application file for complete search history.

(56) References Cited

U.S. PATENT DOCUMENTS

| | | |
|---|---|---|
| 2018/0294424 A1 | 10/2018 | Toyoda |
| 2020/0028122 A1 | 1/2020 | Hu et al. |

(Continued)

FOREIGN PATENT DOCUMENTS

| | | |
|---|---|---|
| CN | 107425131 | 12/2017 |
| CN | 108231861 | 6/2018 |
| CN | 108807706 | 11/2018 |

*Primary Examiner* — Caleb E Henry
(74) *Attorney, Agent, or Firm* — Leason Ellis LLP

(57) ABSTRACT

A display panel and a method for manufacturing a display panel are disclosed. The display panel includes a first sub-pixel region and a second sub-pixel region which are adjacent to each other. The display panel includes a substrate and a first conductive layer, an organic functional layer, and a second conductive layer which are sequentially on the substrate. The organic functional layer includes a charge generation layer, and the charge generation layer includes a first charge generation layer portion and a second charge generation layer portion which are in the first sub-pixel region and the second sub-pixel region, respectively. The display panel further includes a spacer between the first sub-pixel region and the second sub-pixel region, and the spacer disconnects the first charge generation layer portion and the second charge generation layer portion.

20 Claims, 9 Drawing Sheets

(51) Int. Cl.
 H01L 51/50 (2006.01)
 H01L 51/56 (2006.01)

(56) References Cited

U.S. PATENT DOCUMENTS

| | | | | |
|---|---|---|---|---|
| 2020/0388658 | A1* | 12/2020 | Tsaur | .................... H01L 51/56 |
| 2020/0395403 | A1* | 12/2020 | Ahmed | .................... H01L 33/22 |
| 2020/0411489 | A1* | 12/2020 | Ahmed | .................... H01L 33/42 |
| 2020/0411490 | A1* | 12/2020 | Ahmed | ............... H01L 29/7869 |
| 2020/0411491 | A1* | 12/2020 | Ahmed | .................... H01L 33/42 |
| 2020/0411717 | A1* | 12/2020 | Keates | ................ H01L 33/0075 |

\* cited by examiner

DISPLAY PANEL AND METHOD FOR MANUFACTURING DISPLAY PANEL

CROSS-REFERENCE TO RELATED PATENT APPLICATIONS

This application is a U.S. National Stage Application under 35 U.S.C. § 371 of International Patent Application No. PCT/CN2019/102311, filed Aug. 23, 2019, which is incorporated by reference in its entirety.

TECHNICAL FIELD

Embodiments of the present disclosure relate to a display panel, and a method for manufacturing a display panel.

BACKGROUND

Micro OLED (Micro OLED) displays involve a combination of organic light emitting diode (OLED) technology and CMOS technology, and are related to the cross integration of the optoelectronic industry and the microelectronic industry. They promote the development of a new generation of micro display technology, and improve the research and development for organic electrons on silicon, even for molecular electrons on silicon.

Micro OLED displays have excellent display characteristics such as high resolution, high brightness, rich colors, low driving voltage, fast response speed, low power consumption and so on, and have broad development prospects.

SUMMARY

At least one embodiment of the present disclosure provides a display panel which comprises a first sub-pixel region and a second sub-pixel region which are adjacent to each other. The display panel comprises a substrate and a first conductive layer, an organic functional layer, and a second conductive layer which are sequentially on the substrate, and the organic functional layer comprises a charge generation layer. The first conductive layer comprises a first electrode and a second electrode which are insulated from each other and in the first sub-pixel region and the second sub-pixel region, respectively, the charge generation layer comprises a first charge generation layer portion and a second charge generation layer portion which are in the first sub-pixel region and the second sub-pixel region, respectively, the second conductive layer comprises a third electrode and a fourth electrode which are coupled to each other and in the first sub-pixel region and the second sub-pixel region, respectively, and the third electrode and the fourth electrode are an integrated structure. The first electrode, the first charge generation layer portion, and the third electrode form a first light emitting element, and the second electrode, the second charge generation layer portion, and the fourth electrode form a second light emitting element. The display panel further comprises a spacer between the first light emitting element and the second light emitting element, and the spacer disconnects the first charge generation layer portion and the second charge generation layer portion. The charge generation layer further comprises a third charge generation layer portion, the third charge generation layer portion is between the spacer and the second conductive layer, and the third charge generation layer portion is disconnected from the first charge generation layer portion and the second charge generation layer portion respectively. The display panel further comprises a drive circuit, the drive circuit is electrically coupled to the first light emitting element and the second light emitting element and configured to drive the first light emitting element and the second light emitting element, and the drive circuit comprises a transistor and the transistor comprises a semiconductor layer which is inside the substrate.

In some examples, in a direction perpendicular to the substrate, a ratio of a height of the spacer to a height of the first charge generation layer portion or the second charge generation layer portion ranges from 0.7 to 2.5, with a surface of the first conductive layer which is away from the substrate as a reference surface.

In some examples, in a direction perpendicular to the substrate, a height of the spacer ranges from 125 nm to 175 nm, and a height of the first charge generation layer portion or the second charge generation layer portion ranges from 70 nm to 170 nm, with a surface of the first conductive layer which is away from the substrate as a reference surface.

In some examples, an average thickness of the organic functional layer ranges from 200 nm to 350 nm.

In some examples, an angle between a side surface and a top surface of the spacer is less than 100°.

In some examples, a thickness of the organic functional layer at a center of the first sub-pixel region or the second sub-pixel region in a direction pointing to the spacer becomes thinner.

In some examples, a material of the spacer is a negative photoresist material or an inorganic insulating material.

In some examples, the first light emitting element and the second light emitting element are configured to emit white light, respectively.

In some examples, the organic functional layer further comprises a plurality of light emitting layers which are stacked in a direction perpendicular to the substrate.

In some examples, at least two light emitting layers of the plurality of light emitting layers are coupled in series with each other, and the charge generation layer is between two adjacent light emitting layers of at least two light emitting layers.

In some examples, the plurality of light emitting layers comprise a red-green light emitting layer and a blue light layer, the red-green light emitting layer and the blue light layer are coupled in series with each other, and the charge generation layer is between the red-green light emitting layer and the blue light layer.

In some examples, the red-green light emitting layer comprises a red light layer and a green light layer which are adjacent to each other, and the red light layer is closer to the first conductive layer.

In some examples, the charge generation layer comprises a N-type charge generation layer and a P-type charge generation layer which are stacked.

In some examples, the organic functional layer further comprises an electron transport layer and a hole transport layer which are on both sides of the charge generation layer, respectively, the N-type charge generation layer is closer to the electron transport layer, and the P-type charge generation layer is closer to the hole transport layer.

In some examples, the second conductive layer is a cathode layer, and the hole transport layer is between the charge generation layer and the second conductive layer, and the hole transport layer continuously covers the first sub-pixel region, the second sub-pixel region, and the spacer between the first sub-pixel region and the second sub-pixel region.

In some examples, the display panel further comprises a third light emitting element in a third sub-pixel region. The first light emitting element, the second light emitting element, and the third light emitting element form a pixel cell.

In some examples, the display panel further comprises a color film layer. The color film layer is on a side of the first light emitting element and the second light emitting element which is away from the substrate.

In some examples, the charge generation layer is a material layer which has a highest conductivity in the organic functional layer.

At least one embodiment of the present disclosure also provides a method for manufacturing a display panel, the display panel comprises a first sub-pixel region and a second sub-pixel region which are adjacent to each other, and the method comprises: providing a substrate, and forming a drive circuit, forming a first conductive layer, an organic functional layer, and a second conductive layer on the substrate sequentially. The first conductive layer comprises a first electrode and a second electrode which are insulated from each other and in the first sub-pixel region and the second sub-pixel region respectively, the organic functional layer comprises a charge generation layer, the charge generation layer comprises a first charge generation layer portion and a second charge generation layer portion which are in the first sub-pixel region and the second sub-pixel region respectively, the second conductive layer comprises a third electrode and a fourth electrode which are coupled to each other and in the first sub-pixel region and the second sub-pixel region respectively, and the third electrode and the fourth electrode are an integrated structure, the first electrode, the first charge generation layer portion, and the third electrode form a first light emitting element, and the second electrode, the second charge generation layer portion, and the fourth electrode form a second light emitting element. The method also comprises forming a spacer between the first light emitting element and the second light emitting element. The drive circuit is electrically coupled to the first light emitting element and the second light emitting element and configured to drive the first light emitting element and the second light emitting element. The drive circuit comprises a transistor and the transistor comprises a semiconductor layer which is inside the substrate. The spacer disconnects the first charge generation layer portion and the second charge generation layer portion. The organic functional layer further comprises a third charge generation layer portion, the third charge generation layer portion is between the spacer and the second conductive layer, and the third charge generation layer portion is disconnected from the first charge generation layer portion and the second charge generation layer portion, respectively.

In some examples, in a direction perpendicular to the substrate, a ratio of a height of the spacer to a height of the first charge generation layer portion or the second charge generation layer portion ranges from 0.7 to 2.5, with a surface of the first conductive layer which is away from the substrate as a reference surface.

In some examples, in a direction perpendicular to the substrate, a height of the spacer ranges from 125 nm to 175 nm, and a height of the first charge generation layer portion or the second charge generation layer portion ranges from 70 nm to 170 nm, with a surface of the first conductive layer which is away from the substrate as a reference surface.

In some examples, a material of the spacer is a negative photoresist material or an inorganic insulating material.

BRIEF DESCRIPTION OF THE DRAWINGS

In order to more clearly illustrate the technical schemes of the embodiments of the present disclosure, the drawings of the embodiments required in the description of the embodiments or related technologies will be briefly described in the following. It is obvious that the described drawings below are only related to some embodiments of the disclosure and are not limitative to the disclosure.

DETAILED DESCRIPTION

Figure 1A:
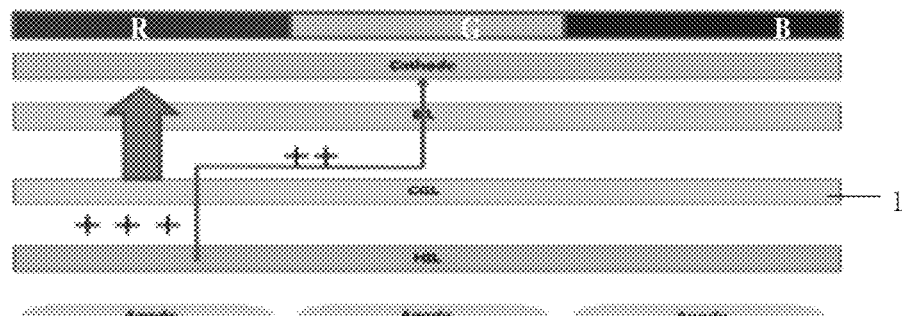
FIG. 1A is a diagram of an electrical leakage of an OLED display light emitting device.

Technical schemes of the embodiments of the present disclosure will be described clearly and completely in connection with the drawings. With reference to the non-limiting example embodiments illustrated in the drawings and detailed in the following description, the example embodiments of the present disclosure and their various features and advantageous details will be illustrated more fully. It should be noted that the features illustrated in the drawings are not necessarily drawn to scale. The descriptions of known materials, components, and process technologies are omitted from the present disclosure so as not to obscure exemplary embodiments of the present disclosure. The examples given are only intended to facilitate understanding of the implementations of the example embodiments of the present disclosure and to further enable those skilled in the art to implement the example embodiments. Therefore, these examples should not be construed as limiting the scope of the embodiments of the present disclosure.

Unless otherwise defined, all the technical and scientific terms used herein have the same meanings as commonly understood by those of ordinary skill in the art to which the present disclosure belongs. The terms "first," "second," etc., which are used in the present disclosure, are not intended to indicate any sequence, amount or importance, but used to distinguish various components. The terms, such as "comprise/comprising," "include/including," etc., are intended to specify that the elements or the objects stated before these terms encompass the elements or the objects and equivalents thereof listed after these terms, but not preclude other elements or objects. The terms, "on," "under," "left," "right," etc., are only used to indicate a relative position relationship, and when the position of the object which is described is changed, the relative position relationship may be changed accordingly.

Micro OLED displays generally have a size of less than 100 microns, e.g., a size of less than 50 microns, etc., and involve a combination of organic light emitting diode (OLED) technology and CMOS technology, so as to manufacture an OLED array on a silicon substrate that includes a CMOS circuit.

In general, an OLED device is formed by evaporating different organic functional layers (e.g., electron/hole injection layers) using a fine metal mask (FMM), for example, the FMM is used to pattern the organic functional layers so as to form respective patterns in different pixel regions. However, a FMM has limited precision and cannot achieve high image resolution (i.e. pixels per inch, PPI for short), which limits the resolution of an OLED device. Therefore, full-color display can be implemented by combining a white OLED with a color film layer. However, in this process, an organic functional layer is usually formed into a continuous structure that covers a plurality of sub-pixel regions, and in this case, an electrical leakage often occurs in a lateral direction, causing the color cross-talk between sub-pixels and reducing the color gamut of a display device. For example, an organic functional sub-layer such as electron injection layer (EIL), hole injection layer (HIL), light emitting layer, charge generation layer (CGL) and the like in an OLED device usually includes metal elements, such as metal ions or heavily doped materials containing metal elements, which will generate moving charges under the action of voltage, thus causing the electrical leakage between sub-pixels in a lateral direction, and further causing the problem of color cross-talk. In an aspect, the charge generation layer is usually an organic functional sub-layer having the largest conductivity among organic functional layers between cathode and anode, for example, the conductivity of the charge generation layer is higher than that of the electron injection layer, hole injection layer, electron transport layer, hole transport layer, etc. In another aspect, the electron injection layer usually touches the cathode of the OLED device and the hole injection layer usually touches the anode of the OLED device, and the moving charges generated by the two layers can leak through the electrodes that the two layers touch respectively, which makes smaller contribution to the lateral leakage, thus a main factor causing the lateral leakage is the charge generation layer.

A charge generation layer (CGL) is a structure for connecting a plurality of OLEDs in series in a tandem OLED structure, and usually includes an N-type charge generation layer and a P-type charge generation layer. Electrons and holes can be regenerated at serial nodes of the OLEDs so as to improve the injection capability of carriers, thereby improving the light emitting efficiency of a device. The N-type charge generation layer may be formed of an organic layer doped with an alkali metal such as lithium (Li), sodium (Na), potassium (K) or cesium (Cs) or an alkaline earth metal such as magnesium (Mg), strontium (Sr), barium (Ba) or radium (Ra) (but not limited to any of them). The P-type charge generation layer may be formed of an organic layer obtained by doping an organic matrix material having hole transport capability with a dopant.

Figure 1B:
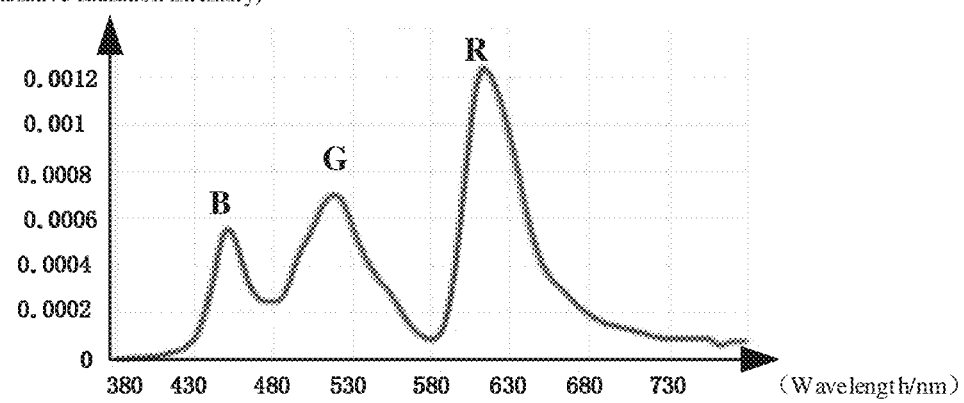
FIG. 1B is a first spectral diagram of an OLED display light emitting device.

FIG. 1A illustrates a schematic diagram of the occurrence of color cross-talk in an OLED display device, and FIG. 1B is a spectral diagram of the OLED display device. The OLED display device adopts a white OLED and a color film layer together, so as to realize full-color display. As illustrated in FIG. 1A and FIG. 1B, in the case where a sub-pixel of a red light region (R) is lit, an electrical leakage occurs in a charge generation layer (CGL)1, causing an adjacent green light region (G) which is in a non-light emitting state, for example, to emit light, so that the light emitting purity of a single sub-pixel (including, for example, red, green and blue sub-pixels) is reduced, which causes the color gamut of the entire OLED display device to be reduced.

Figure 1C:
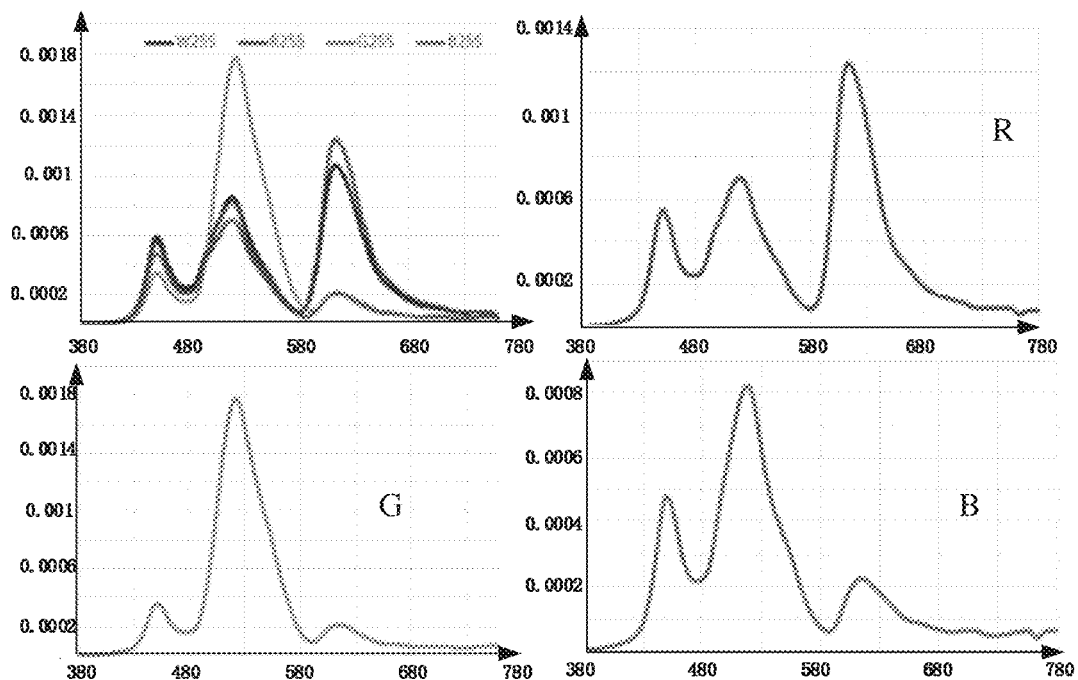
FIG. 1C is a second spectral diagram of an OLED display light emitting device.

FIG. 1C illustrates another example of a spectral diagram of an OLED display device, and a spectral diagram in which three sub-pixels (red (R), green (G), and blue (B) sub-pixels) are simultaneously lit and three spectral diagrams in which the three sub-pixels are respectively lit are illustrated. As illustrated in FIG. 1C, in the case where the three sub-pixels are respectively lit, light of different colors escapes from adjacent sub-pixels, which causes the color gamut of the entire OLED display device to be reduced. According to calculation, the color gamut index (NTSC) of the OLED display device is only 30%.

The embodiments of the present disclosure provide a display panel, the display panel provides a spacer between adjacent sub-pixel regions, so that a charge generation layer is naturally disconnected at the spacer during deposition, i.e., the charge generation layer in the adjacent sub-pixel regions is disconnected by the spacer, thereby effectively avoiding color cross-talk between sub-pixels caused by the lateral leakage of the charge generation layer, improving the color gamut of the display panel, and improving display quality.

Figure 2A:
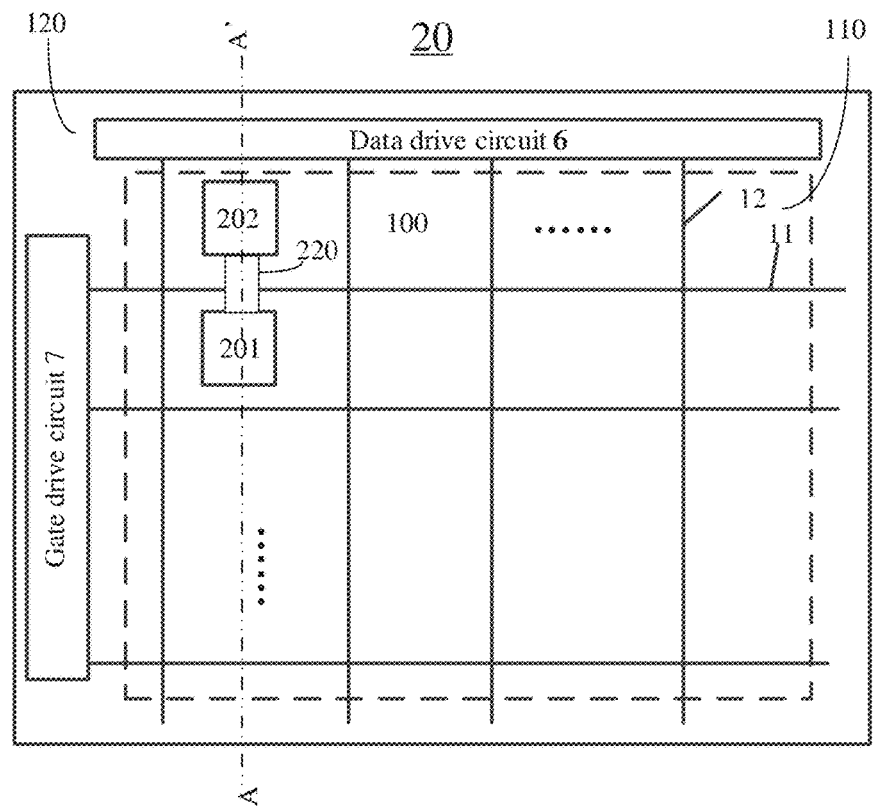
FIG. 2A is a first schematic plan view of a display panel provided by some embodiments of the present disclosure.

FIG. 2A is a schematic plan view of a display panel provided by some embodiments of the present disclosure. As illustrated in FIG. 2A, the display panel 20 includes a plurality of gate lines 11 and a plurality of data lines 12, and the plurality of gate lines 11 and the plurality of data lines 12 cross each other so as to define a plurality of sub-pixel regions 100 arranged in an array in a display region 110. Each sub-pixel region 100 is provided with one sub-pixel, and each sub-pixel includes a light emitting element and a drive circuit used to drive the light emitting element. The drive circuit is, for example, a conventional pixel circuit. For example, the drive circuit includes a conventional 2T1C (i.e., two transistors and one capacitor) pixel circuit, a nTmC (n, m are positive integers) pixel circuit such as 4T2C, 5T1C, 7T1C, etc., and in different embodiments, the drive circuit may further include a compensation circuit that includes an internal compensation circuit or an external compensation circuit, and the compensation circuit may include transistors, capacitors, etc. For example, the drive circuit may further include a reset circuit, a light emission control circuit, a detection circuit, and the like as required. For example, the display panel may further include a data drive circuit 6 and a gate drive circuit 7 in a non-display region 120 outside the display region 110, and the data drive circuit 6 and the gate drive circuit 7 are respectively connected to the drive circuit of the light emitting element through the data lines 12 and the gate lines 11 so as to provide electrical signals. The data drive circuit 6 is used for providing data signals, and the gate drive circuit 7 is used for providing scanning signals, and can be further used for providing various control signals, power supply signals and the like.

In other examples, for example, the display panel uses a silicon substrate as a substrate 101, and a drive circuit (pixel circuit) 206, the gate drive circuit 6, and the data drive circuit 7 can all be integrated on the silicon substrate. In this case, because a silicon-based circuit can achieve higher accuracy, the gate drive circuit 6 and the data drive circuit 7 may also be formed in a region corresponding to the display region of the display panel, for example, and may not necessarily be in the non-display region.

Figure 2B:
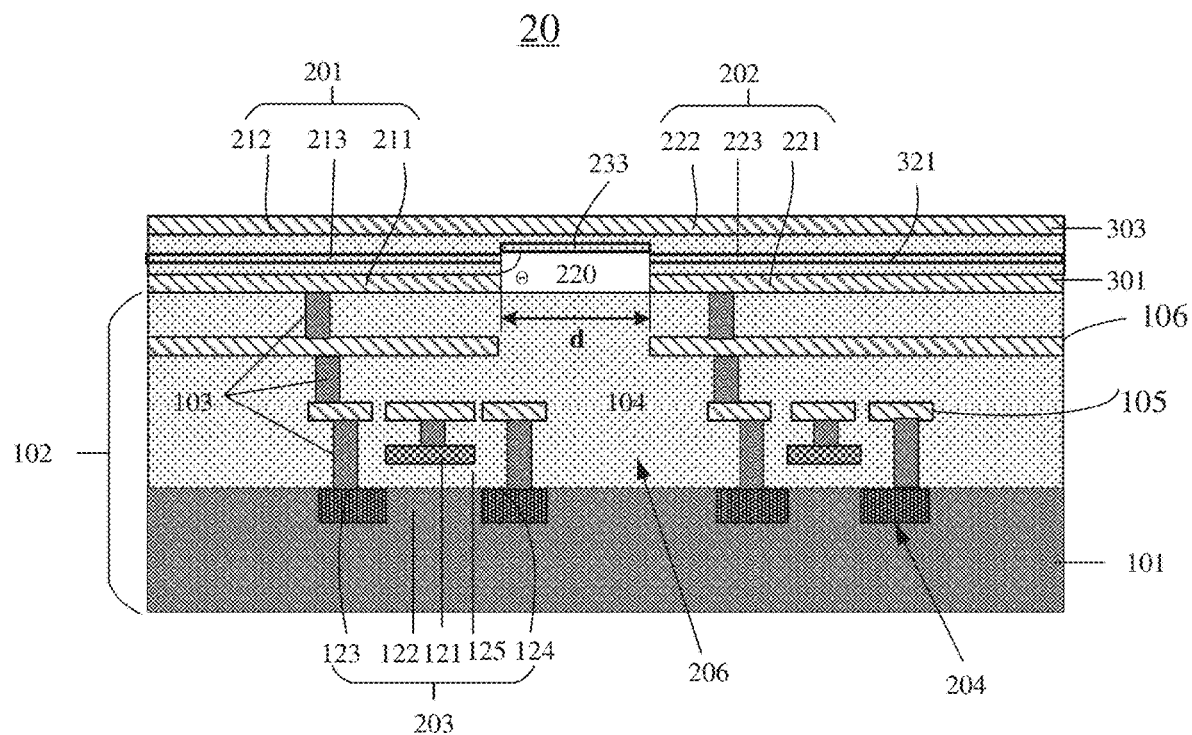
FIG. 2B is an enlarged view of a portion of a display panel provided by some embodiments of the present disclosure.

FIG. 2B illustrates an example of a cross-sectional view of the display panel illustrated in FIG. 2A along the direction A-A'. For clarity, only adjacent first sub-pixel region and second sub-pixel region are illustrated in FIG. 2B, and for each sub-pixel region, only a light emitting element and a transistor directly connected to the light emitting element in the drive circuit 206 are illustrated. For example, the transistor may be a drive transistor, and configured to control the magnitude of the current used to drive the light emitting element to emit light. For example, the transistor may also be a light emission control transistor, and configured to control whether the current used to drive the light emitting element to emit light can flow through, and the embodiments of the present disclosure are not limitative to this. As illustrated in FIG. 2B, the display panel 20 includes a substrate 101, and a first conductive layer 301, an organic functional layer 302, and a second conductive layer 303 which are on the substrate 101. The organic functional layer 302 includes a charge generation layer 321. The first conductive layer 301 includes a first electrode 211 and a second electrode 221 that are insulated from each other and in the first sub-pixel region and the second sub-pixel region respectively, and the first electrode 211 and the second electrode 221 are disconnected from each other. The second conductive layer 303 includes a third electrode 212 and a fourth electrode 222 which are coupled to each other and in the first sub-pixel region and the second sub-pixel region respectively. The third electrode 212 and the fourth electrode 222 are an integrated structure, that is, the third electrode 212 and the fourth electrode 222 are a continuous and smooth structure formed by a same conductive material layer, and there is no interface in the second conductive layer.

As illustrated in FIG. 2B, the display panel provided by the embodiments of the present disclosure may be formed on a silicon substrate, and the drive circuit 206 may be integrated on the silicon substrate so as to form a drive substrate 102. A first light emitting element 201 and a second light emitting element 202 are formed on the drive substrate 102 that includes the silicon substrate 101, the drive substrate 102 includes the drive circuit 206 formed on the silicon substrate 101, and the drive substrate 102 is such as a monocrystalline silicon or high purity silicon. The drive circuit 206 is formed on the silicon substrate 101 by a semiconductor process. For example, an active layer (i.e., a semiconductor layer), a first electrode and a second electrode of a transistor are formed in the silicon substrate 101 by a doping process, an insulating layer 104 is formed by a silicon oxidation process, and a plurality of conductive layers 105, 106 are formed by a sputtering process, and the like. The semiconductor layer of the transistor (such as the active layer 122 in FIG. 2B) is located inside the substrate 101 or is part of the substrate 101.

Figure 2C:
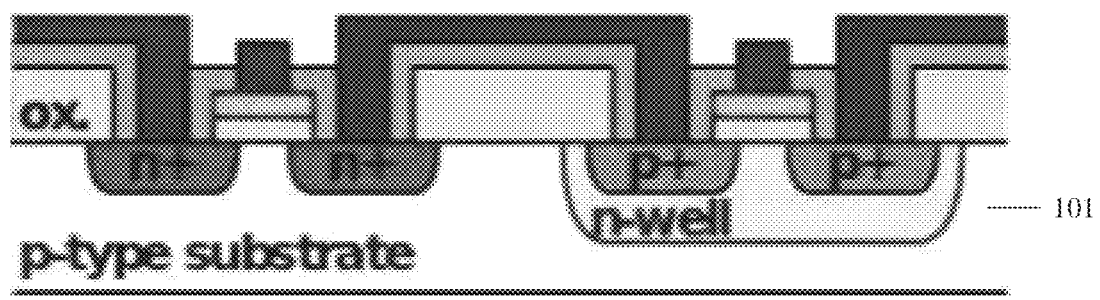
FIG. 2C is a first cross-sectional view of a display panel provided by some embodiments of the present disclosure.

For example, the drive circuit 206 includes a complementary metal oxide semiconductor circuit (CMOS circuit). FIG. 2C illustrates a specific example of the formation of a PMOS transistor and NMOS transistor in a silicon substrate. As illustrated in FIG. 2C, the NMOS transistor and PMOS transistor are integrated in a p-type silicon substrate, an active layer of the NMOS transistor is part of the p-type substrate, and an active layer of the PMOS transistor is obtained by n-type doping in the p-type substrate.

For example, the gate drive circuit 6 and the data drive circuit 7 may also be integrated in the silicon substrate 101 by the semiconductor process. The gate drive circuit and the data drive circuit may adopt conventional circuit structures in the art, and the embodiments of the present disclosure are not limitative to this.

As illustrated in FIG. 2B, the first electrode 211 of the first light emitting element 201 is formed on a surface of the drive substrate 102, and is electrically connected to a first electrode 123 of a first transistor 203 through a contact hole 103 filled with a conductive material (e.g., tungsten) and a plurality of conductive layers. FIG. 5A exemplarily illustrates one insulating layer 104 and two conductive layers 105 and 106, however, the embodiments of the present disclosure are not limitative to the number of layers of the insulating layer 104 and the conductive layer.

For example, as illustrated in FIG. 2B, the topmost conductive layer 106 in the drive substrate 102 has reflectivity, such as a stacked structure of a titanium/titanium nitride/aluminum. For example, the conductive layer 106 includes a plurality of sub-layers arranged at intervals, which respectively corresponds to a plurality of electrodes included in the first conductive layer 301 one to one. In a top emission structure, the conductive layer 106 may be provided as a reflective layer used for reflecting the light emitted from the light emitting element so as to improve the light emitting efficiency. For example, an orthographic projection of each electrode in the first conductive layer 301 on the substrate 101 falls within an orthographic projection of the portion of the conductive layer 106 corresponding to the electrode on the substrate 101. In this case, the first conductive layer 301 may adopt a transparent conductive oxide material that has a high work function, such as ITO, IZO, IGZO, AZO, etc.

Relying on mature CMOS integrated circuit technology, a silicon-based process can achieve higher precision (PPI can reach 65,000 or even more than 10,000, for example). For example, a distance d between the first electrode 211 of the first light emitting element 201 and the first electrode 221 of the second light emitting element 202 (i.e., the width of a spacer 220) is less than 1 micron.

The organic functional layer 302 includes a first organic functional layer and a second organic functional layer located in the first sub-pixel region and the second sub-pixel region, respectively. The first electrode 211, the first organic functional layer, and the third electrode 212 form the first light emitting element 201, and the second electrode 221, the second organic functional layer and the fourth electrode 222 form the second light emitting element 202.

For example, the first light emitting element 201 or the second light emitting element 202 may be an organic light emitting diode (OLED) or a quantum dot light emitting diode (QLED), etc., and the embodiments of the present disclosure are not limitative to the type of a light emitting element. For example, a light emitting layer of an OLED may be a small molecular organic material or a high molecular organic material.

The organic functional layer 302 includes hierarchical structures that are stacked on each other in a direction perpendicular to the substrate 101, and includes the charge generation layer 321. For example, the organic functional layer 302 further includes at least two light emitting layers connected in series by a charge generation layer, and may further include an electron/hole transport layer, an electron/hole injection layer, an electron/hole blocking layer, and the like, as required.

In FIG. 2B, only the charge generation layer 321 in the organic functional layer 302 is schematically illustrated, while other functional layers are not labeled in detail. The charge generation layer 321 includes a first charge generation layer portion 213 and a second charge generation layer portion 223 which are in the first sub-pixel region and the second sub-pixel region, respectively. The display panel 20 further includes a spacer 220 between the first light emitting element 201 and the second light emitting element 202, and the spacer 220 disconnects the first charge generation layer portion 213 and the second charge generation layer portion 223. For example, as illustrated in FIG. 2B, the spacer 220 is between the first electrode 211 and the second electrode 221, and extends in a direction perpendicular to the substrate 101, so that the first charge generation layer portion 213 and the second charge generation layer portion 223 are disconnected, i.e., the first charge generation layer portion 213 and the second charge generation layer portion 223 are spaced apart from each other without connection or contact.

As illustrated in FIG. 2B, the charge generation layer 302 further includes a third charge generation layer portion 233, and the third charge generation layer portion 233 is between the spacer 220 and the second conductive layer 303 and disconnected from the first charge generation layer portion 213 and the second charge generation layer portion 223, respectively.

For example, in a direction perpendicular to the substrate 101, a ratio of the height of the spacer 220 to the height of a portion of the charge generation layer 321 which is in a sub-pixel region (i.e., the first charge generation layer portion 213 or the second charge generation layer portion 223) ranges from 0.7 to 2.5, with a surface of the first conductive layer 301 which is away from the substrate 101 as a reference surface.

By providing the spacer 220 between the first light emitting element 201 and the second light emitting element 202, the charge generation layer can be effectively disconnected between adjacent sub-pixel regions, thereby effectively avoiding the color cross-talk between sub-pixels caused by the lateral leakage of the charge generation layer, improving the color gamut of the display panel, and improving display quality.

The inventors further noted that the height of the spacer relative to the charge generation layer in a sub-pixel, in a direction perpendicular to the substrate, affects the quality of the generated charge generation layer. If the height of the spacer relative to the charge generation layer is too low, the charge generation layer cannot be effectively disconnected. If the height of the spacer relative to the charge generation layer is too high, a crack generated by the charge generation layer at the spacer can spread into a light emitting element in the sub-pixel region, thereby, seriously affecting the quality of the charge generation layer in the sub-pixel and further reducing the performance of the light emitting element. By setting the ratio of the height of the spacer 220 to the height of the portion of the charge generation layer 321 which is in a sub-pixel region (in a direction perpendicular to the substrate 101, and with the first conductive layer 301 as a reference surface) ranges from 0.7 to 2.5, a charge generation layer having good blocking effect and without affecting the film forming quality of the sub-pixel region can be obtained.

Figure 2D:
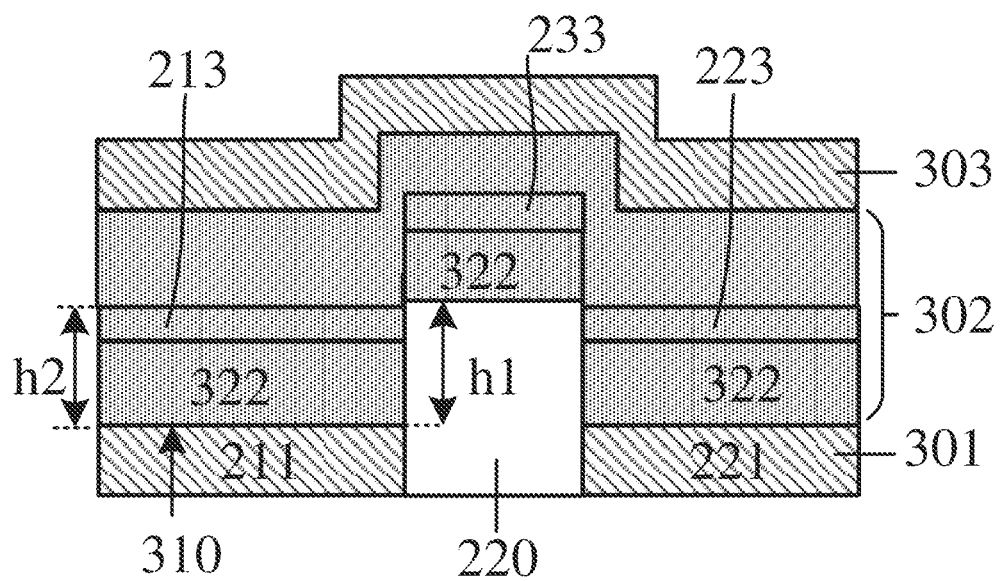
FIG. 2D is a second cross-sectional view of a display panel provided by some embodiments of the present disclosure.

FIG. 2D schematically illustrates an enlarged view of a portion of a display panel at the spacer 220. As illustrated in FIG. 2D, in a direction perpendicular to the substrate 101, and with the surface 310 of the first conductive layer 301 which is away from the substrate 101 as a reference surface, a ratio h1/h2 of the height h1 of the spacer 220 to the height h2 of the portion of the charge generation layer 321 that is located in the sub-pixel region ranges from 0.7 to 2.5. For example, the height of the spacer 220 relative to the reference surface is greater than or equal to the height of the first charge generation layer portion 213 or the second charge generation layer portion 223 relative to the reference surface. For example, h1/h2 ranges from 1 to 2.5, or further from 1 to 1.5.

Figure 3A:
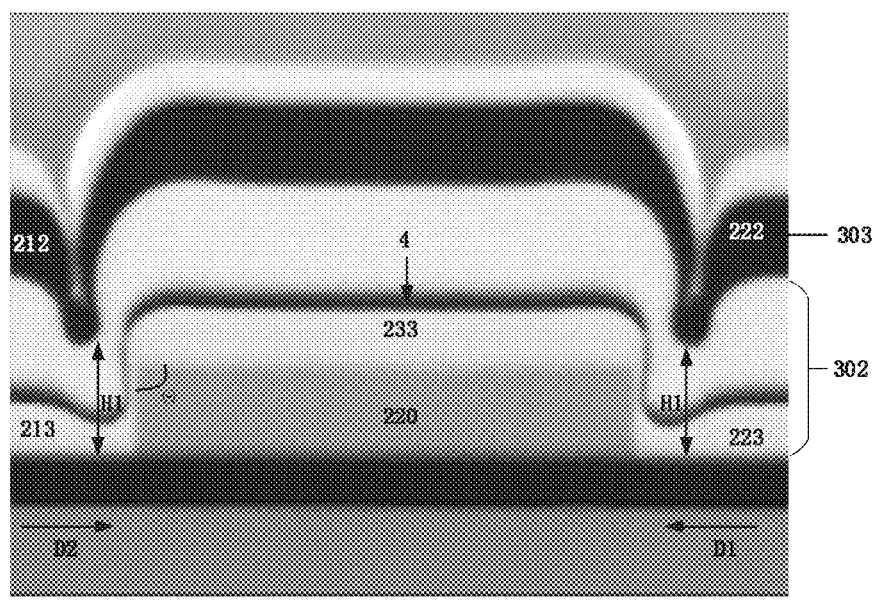
FIG. 3A is an SEM image of a display panel provided by some embodiments of the present disclosure.
Figure 3B:
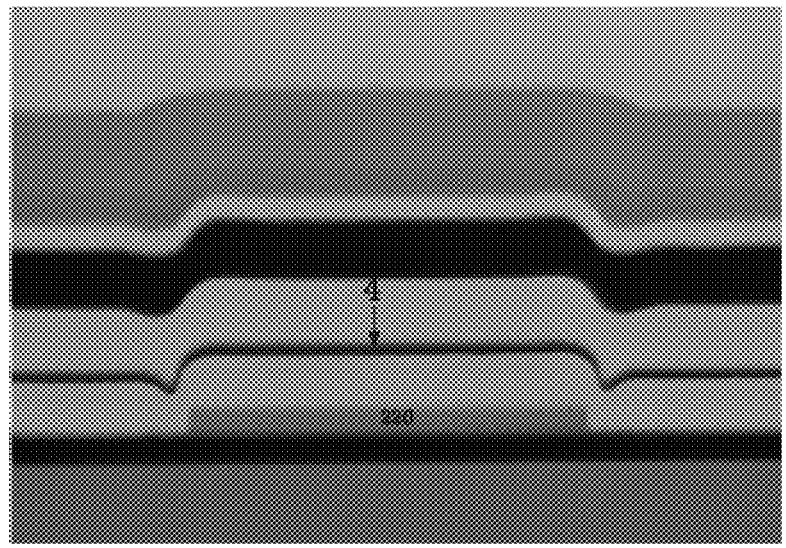
FIG. 3B is a first SEM image of a display panel.
Figure 3C:
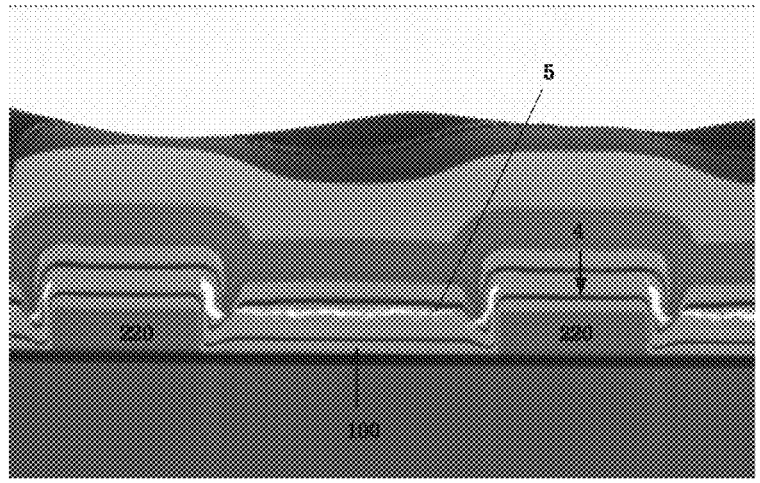
FIG. 3C is a second SEM image of a display panel.

FIGS. 3A, 3B, and 3C respectively illustrate partial cross-sectional scanning electron microscope (SEM) images of the display panel under three conditions that the height of the spacer is appropriate, too low, and too high.

As illustrated in FIG. 3A, the hierarchical structure shown as black and indicated by the numeral 4 in the figure is an auxiliary layer that is used for auxiliary judgment and formed above and immediately adjacent to the charge generation layer, and the auxiliary layer does not exist in the actual device. As can be seen from FIG. 3A, the organic functional layer which is below the auxiliary layer 4 is substantially completely disconnected, at the corresponding spacer 220, that is, the charge generation layer is disconnected.

For example, an angle Θ between a side surface and a top surface of the spacer 220 is less than 100°. For example, the angle is 90°-100°, and for example, the cross section of the spacer 220 in the direction perpendicular to the substrate 101 is positive trapezoidal. For example, the angle is 90°, and for example, the cross section of the spacer 220 in the direction perpendicular to the substrate 101 is rectangular. For example, the angle is less than 90°, and for example, the cross section of the spacer 220 in a direction perpendicular to the substrate 101 is inverted trapezoidal. Because the thermal evaporation energy is small in the evaporation process of organic materials, it is difficult for organic materials to be continuously deposited at a side wall of the spacer 220 which has a large slope, so that disconnection occurs at the side wall of the spacer 220.

For example, as illustrated in FIG. 3A, a thickness H1 of the organic functional layer close to the spacer 220 is smaller, which is because organic materials are difficult to adhere to the side wall of the spacer 220 which has a large slope. For example, in directions D1 and D2 pointing to the spacer 220, a thickness of the organic functional layer 302 at a center of a sub-pixel region gradually becomes thinner.

For example, as illustrated in FIG. 3A, similarly, a thickness of the second conductive layer 303 close to the spacer 220 is smaller, which is because the thermal evaporation energy is small in the evaporation process, and the deposited materials are difficult to adhere to the side wall of the spacer 220 which has a large slope. For example, in directions D1 and D2 pointing to the spacer 220, a thickness of the second conductive layer 303 at a center of a sub-pixel region gradually becomes thinner.

As illustrated in FIG. 3A, the third electrode 212 and the fourth electrode 222 are an integrated structure, and the second conductive layer 302 is a continuous and smooth structure, in which there is no interface.

For example, in order to avoid the disconnection of the second conductive layer 303, the thickness of the second conductive layer 303 may be greater than 100 nanometers.

For example, a material of the spacer 220 is a negative photoresist material or an inorganic insulating material, such as silicon nitride or oxide.

For example, in a direction perpendicular to the substrate 310, and with the surface 310 of the first conductive layer 301 which is away from the substrate 101 as a reference surface, a ratio of the height h1 of the spacer 220 to the height h2 of the first charge generation layer portion 213 or the second charge generation layer portion 223 ranges from 0.7 to 2.5.

In other words, even though the ratio of the height of the spacer to the height of the charge generation layer in the sub-pixel is not necessarily greater than 1, the spacer can have a disconnection function on the charge generation layer. This is because in the deposition process, a portion 322 of the organic functional layer 302 which is below the charge generation layer 321 (the portion generated before the charge generation layer 321) is formed on the spacer 220, which is equivalent to increasing the height of the spacer and will contribute to the deposition of the charge generation layer 321.

For example, with the surface 310 of the first conductive layer 301 which is away from the substrate 101 as a reference surface, the height of the spacer 220 in a direction perpendicular to the substrate 101 ranges from 125 nm to 175 nm, for example, from 150 nm to 175 nm.

For example, with the surface 310 of the first conductive layer 301 which is away from the substrate 101 as a reference surface, the height of the first charge generation layer portion 213 or the second charge generation layer portion 223 in a direction perpendicular to the substrate 101 ranges from 70 nm to 170 nm, for example, from 100 nm to 150 nm.

For example, a thickness of the organic functional layer 302 ranges from 200 nm to 350 nm, for example, from 250 nm to 300 nm, for example, 250 nm or 300 nm. For example, the light emitting element includes two OLEDs connected in series, and the charge generation layer 231 is located at approximately one third of the thickness of the organic functional layer 302.

For example, with the surface 310 of the first conductive layer 301 which is away from the substrate 101 as a reference surface, the height of the spacer 220 in a direction perpendicular to the substrate 101 is 150 nm, the height of the first charge generation layer portion 213 or the second charge generation layer portion 223 ranges from 70 nm to 80 nm, for example, h1/h2=2. For example, the thickness of the organic functional layer 302 is 250 nm. For example, the portion of the organic functional layer 302 that is above the charge generation layer 321 may not be disconnected at the spacer 220, that is, the organic functional layer 302 may only be partially disconnected.

As illustrated in FIG. 3B, in the case where the height of the spacer 220 is insufficient, the disconnection effect of the portion of the organic functional layer 302 that is below the auxiliary layer 4 is not ideal. The charge generation layer tends to cover a side surface of the spacer 220 so as to form a continuous structure covering the top surface and the side surface of the spacer 220.

As illustrated in FIG. 3C, in the case where the height of the spacer 220 is too high, the organic functional layer 302 is disconnected at the spacer 220, and the crack 5 spreads to the sub-pixel region 110, i.e., a portion of the organic functional layer 302 that is located in a light emitting element in the sub-pixel region 100 cracks, which greatly affects the performance of the light emitting element and reduces the display performance of the display panel 20.

For example, the first light emitting element 201 and the second light emitting element 202 are respectively configured to emit white light, and the embodiments of the present disclosure are not limitative to the structure and light emitting mechanism of the organic functional layer 302.

For example, in order to improve the light emitting efficiency and the color gamut of the light emitting device, it is also possible to use a plurality of light emitting layers that are stacked on each other to emit white light, that is, the organic functional layer 302 includes a plurality of light emitting layers that are stacked in a direction perpendicular to the substrate 101. For example, the organic functional layer 302 includes two light emitting layers (yellow and blue) or three light emitting layers (red, green, and blue) that are stacked on each other.

For example, at least two of the plurality of light emitting layers are connected in series with each other through the charge generation layer 321 so as to form a tandem structure, and the charge generation layer 321 is provided between the plurality of light emitting layers for improving the injection capability of carriers. This tandem structure helps to improve the light emitting efficiency and brightness of the device.

For example, the light-emitting energy levels corresponding to adjacent light emitting layers are relatively close, so that the selection range for materials such as light-emitting layer materials, electron transport materials, hole transport materials, electrode materials and the like of light-emitting elements is larger, and the difficulty for implementation is lower.

For example, the display panel may further include an encapsulation layer 208 and a color film layer 210 which are on a side of the first light emitting element 201 and the second light emitting element 202 that is away from the substrate 101.

Figure 4:
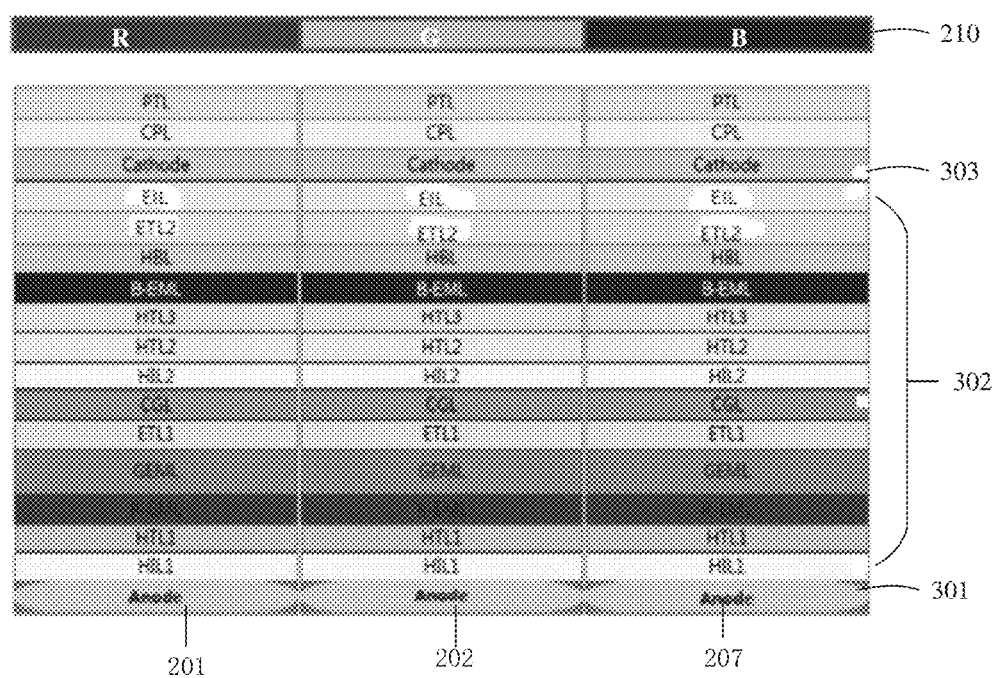
FIG. 4 is a schematic diagram of a structure of a display panel provided by some embodiments of the present disclosure.

FIG. 4 illustrates a schematic diagram of a display panel provided by other embodiments of the present disclosure. As illustrated in FIG. 4, the display panel 20 further includes a third light emitting element 207. For example, the first light emitting element 201, the second light emitting element 202, and the third light emitting element 207 are respectively located in different sub-pixels, thereby forming one pixel cell PX that can emit full-color light in combination with the color film layer 210.

As illustrated in FIG. 4, the organic functional layer 302 includes a red-light layer, a green-light layer, and a blue-light layer, and the red-light layer and the green-light layer are adjacent to each other so as to form a red-green light emitting layer and a blue-light layer, the red-green light emitting layer and the blue-light layer are connected in series with each other, and the charge generation layer 321 is located between the red-green light emitting layer and the blue-light layer.

For example, the organic functional layer 302 illustrated in FIG. 4 includes only one charge generation layer, that is, the first light emitting element, the second light emitting element, or the third light emitting element is a two tandem structure, which helps to simplify the process and save the cost.

It can be understood that the embodiments of the present disclosure are not limitative to the number of the charge generation layers included in the organic functional layer and the number of the light emitting elements connected in series. Because the material layer deposited earlier is more easily disconnected by the spacer 220, thus, in the case where the organic functional layer includes a plurality of charge generation layers, the described h2 should be designed according to the height of the charge generation layer at the topmost layer (farthest from the substrate 101) so as to ensure that all the charge generation layers are disconnected by the spacer.

For example, the organic functional layer 302 further includes an electron transport layer (ETL1) and a hole transport layer (HTL2) which are respectively located on both sides of the charge generation layer 321. A N-type charge generation layer in the charge generation layer 321 is closer to the electron transport layer, and a P-type charge generation layer in the charge generation layer 321 is closer to the hole transport layer.

In this embodiment, with reference to FIG. 2D, the charge transport layer (ETL1), the green-light layer (GEML), the red-light layer (REML), the first hole transport layer (HTL1) and the second hole transport layer (HTL2) which are between the first conductive layer and the charge generation layer form a portion 322 of the organic functional layer 302 that is below the charge generation layer 321 in FIG. 2D.

For example, one of the first conductive layer and the second conductive layer has reflectivity, and the other has semi-permeability or translucency. For example, in the first light emitting element 201, the first electrode 211 and the third electrode 212 form a micro-cavity, so that a distance from each light emitting layer to the reflective layer and the wavelength of light emitted by the respective light emitting layer can meet a relationship: $2\Delta=m\lambda$ (m=1, 2, 3, . . . ), where $\Delta$ is an optical path, and the optical path is equal to the refractive index of a medium multiplied by a distance that light travels in the medium, so that the emitted light and the reflected light resonate in the micro-cavity, thereby improving the purity of light emission and further improving the color gamut and brightness of the display panel.

For example, the light emitting element is a top emission structure, in this case the first conductive layer has reflectivity and the second conductive layer has semi-permeability or translucency. For example, the red-light layer and the green-light layer are located on a side of the charge generation layer that is close to the first conductive layer, and the blue-light layer is located on a side of the charge generation layer that is away from the first conductive layer. For example, the thickness of the organic functional layer 302 is 300 nm, and the height of the charge generation layer 321 is 105 nm with the first conductive layer as a reference surface.

Using such an arrangement, each light emitting layer can satisfy the above-described relationship, and the light emitting purity and brightness can be improved. In another aspect, the red-light layer, the green-light layer, and the blue-light layer are sequentially stacked on the first conductive layer 301, and the red-light layer is closer to the first conductive layer. Because a long-wave luminous material tends to absorb short waves, this arrangement prevents the emitted light from being absorbed by other light emitting layers, thus improving the light emitting efficiency.

For example, the first conductive layer 301 is formed as an anode of a light emitting element, and the second conductive layer 303 is formed as a cathode of the light emitting element. For example, the first conductive layer 301 includes a high work function material, for example, it also has high reflectivity, for example, it is a stacked structure of Ti/Al/Ti/Mo, in which the metal Ti can be used as a buffer layer for improving adhesion between layers, Al can be used as a high reflection material, and Mo can be used as a high work function material in direct contact with the organic functional layer so as to improve the injection capability of carriers. For example, the material of the second conductive layer 303 is a conductive material having low work function and high transmittance, and may be a transparent metal oxide conductive material such as indium zinc oxide (IZO), indium tin oxide (ITO), indium gallium zinc oxide (IGZO), etc., or a transparent nano conductive material such as carbon nanotube, graphene, nano silver wire, etc. For example, in order to prevent the second conductive layer 303 from being disconnecting because of the arrangement of the spacer 220, the thickness of the second conductive layer 303 may be greater than 100 nanometers. In the case where the second conductive layer 303 is a transparent conductive layer, the thickness has little influence on the light transmittance of the transparent conductive layer, because the transparent conductive layer means that the light transmittance is very high.

For example, the organic functional layer further includes a hole injection layer and an electron injection layer. The first conductive layer 301 is formed as an anode of the light emitting element, and the second conductive layer 303 is formed as a cathode of the light emitting element. The hole injection layer is on a side of the charge generation layer 321 that is close to the substrate, and the electron injection layer is on a side of the charge generation layer 321 that is away from the substrate. In this case, it can be understood that the hole injection layer is also disconnected.

For example, a hole transport layer (HTL2) is between the charge generation layer 321 and the second conductive layer 303, and the hole transport layer continuously covers the first sub-pixel region, the second sub-pixel region, and the spacer 220 between the first sub-pixel region and the second sub-pixel region, that is, the organic functional layer 302 is only partially disconnected.

For example, the red light layer, the green light layer, and the blue light layer are CBP: (ppy)2Ir(acac), CBP: FIrpic, and CBP: Btp2Ir(acac) which are obtained by doping red light, green light, and blue light phosphorescent materials into a host material, respectively.

With reference to FIG. 2B again, FIG. 2B illustrates a first transistor 203 and a second transistor 204 electrically connected to the first light emitting element 201 and the second light emitting element 202, respectively. The embodiments of the present disclosure are not limitative to specific types of the first transistor 203 and the second transistor 204. The following is an exemplary description of the first transistor 203. The description is also applicable to the second transistor 204, which is not repeated here.

For example, the first transistor 203 includes a gate electrode 121, a gate insulating layer 125, an active layer 122, a first electrode 123, and a second electrode 124. The embodiments of the present disclosure are not limitative to the type, material, and structure of the first transistor 203. For example, the first transistor 203 may be a top-gate type, a bottom-gate type, etc. The active layer of the first transistor 203 may be an inorganic semiconductor material such as microcrystalline silicon, amorphous silicon, polycrystalline silicon (low temperature polycrystalline silicon or high temperature polycrystalline silicon), oxide semiconductor (e.g., IGZO), or may also be an organic material such as organic semiconductor material such as PBTTT, PDBT-co-TT, PDQT, PDVT-10, dinaphthalo-bithiophene (DNTT), pentacene, or the like. For example, the first transistor 203 may be N-type or P-type.

For example, the first electrode 123 of the first transistor 203 is electrically connected to the first electrode 211 of the first light emitting element 201.

It should be noted that the transistors used in the embodiments of the present disclosure can be thin film transistors, field effect transistors or other switching devices having the same characteristics. Some embodiments of the present disclosure are illustrated by taking a field effect transistor (such as MOS field effect transistor) formed in a silicon substrate as an example, in this example, the silicon substrate is doped (P-type doping or N-type doping) for forming an active layer of the transistor, that is, the active layer of the transistor is inside the silicon substrate, or the active layer of the transistor is part of the silicon substrate. The source electrode and drain electrode of the transistor used herein can be symmetrical in structure, thus the source electrode and drain electrode can be indistinguishable in structure. In the embodiments of the present disclosure, in order to distinguish the two electrodes of a transistor except the gate electrode, for example, one electrode can be directly described as a first electrode, and the other electrode can be directly described as a second electrode.

Figure 5:
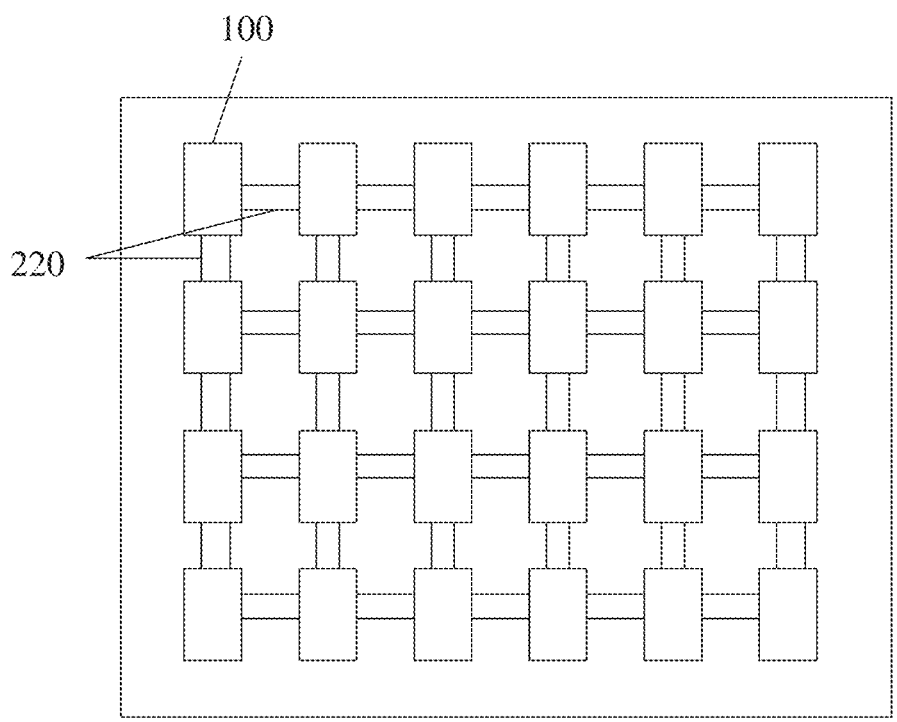
FIG. 5 is a second schematic plan view of a display panel provided by some embodiments of the present disclosure.

FIG. 5 illustrates a schematic plan view of a display panel 20 provided by some embodiments of the present disclosure. As illustrated in FIG. 5, a spacer 220 is provided between each adjacent (in the row direction and the column direction of the pixel array) two sub-pixel regions 100 (light emitting elements).

Figure 6:
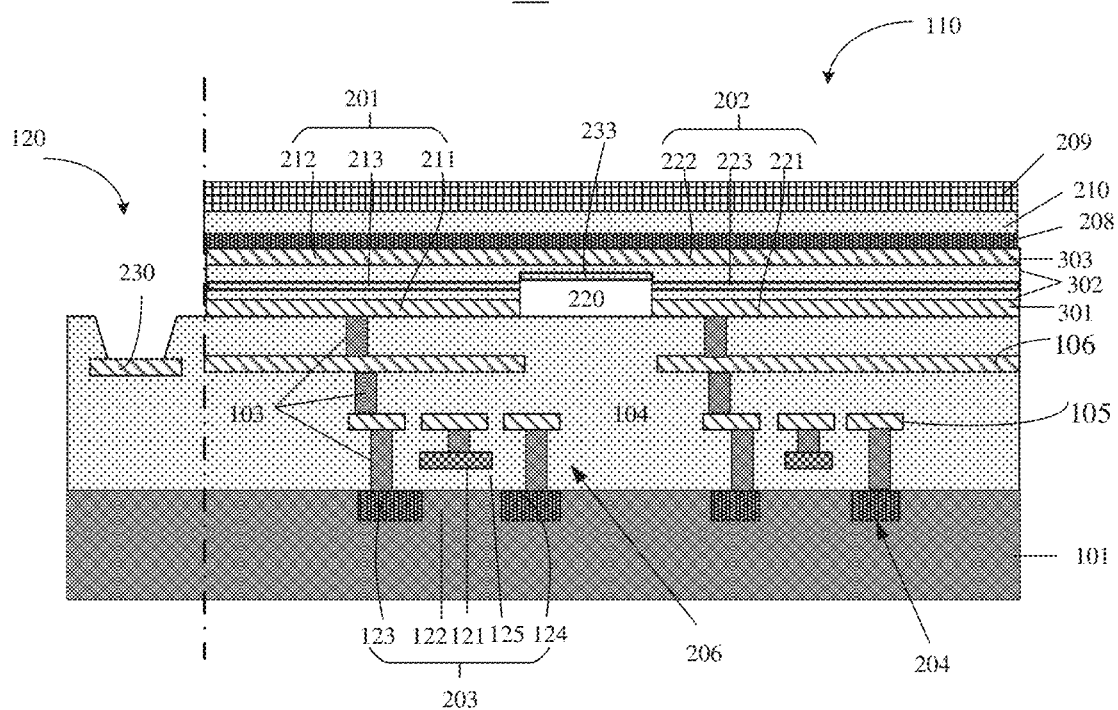
FIG. 6 is a third cross-sectional view of a display panel provided by some embodiments of the present disclosure.

FIG. 6 illustrates another example of a cross-sectional view of FIG. 2A along the direction A-A'. As illustrated in FIG. 6, the display panel 20 further includes a bonding pad 230 in the non-display region 120, and the bonding pad 230 is generally used to bond with an external element so as to provide a signal, such as a power supply voltage signal, to the display panel after devices in the display region are manufactured. The bonding pad 230 can be arranged on the same layer as a conductive structure in the display region 110 so as to save process. For example, the bonding pad 230 may be arranged on the same layer as the conductive layer at the topmost layer (farthest away from the substrate 101) below the light emitting element in the display region 110 so as to facilitate the subsequent bonding process. For example, as illustrated in FIG. 6, the bonding pad 230 is arranged on the same layer as the source and drain electrode layers of a transistor in the display region 110.

It should be noted that the "same layer arrangement" in the embodiments of the present disclosure means that a plurality of structures are formed of the same material film by the same or different patterning processes, thus having the same materials.

For example, the display panel further includes an encapsulation layer 208, a color film layer 210, a cover plate 209, and the like on a side of the first light emitting element 201 and the second light emitting element 202 that is away from the substrate 101. For example, the encapsulation layer 208 is configured to seal a light emitting element so as to prevent external moisture and oxygen from penetrating the light emitting element and the pixel circuit and causing damage to the device. For example, the encapsulation layer 208 includes an organic thin film or a structure including organic thin films and inorganic thin films which are stacked alternately. For example, a water absorbing layer may be provided between the encapsulation layer 208 and the light emitting elements, and the water absorbing layer is configured to absorb water vapor or sol remaining in the preliminary manufacturing process of the light emitting elements. The cover plate 209 is, for example, a glass cover plate. For example, the cover plate 209 and the encapsulation layer 208 may be an integrated structure.

For example, the display panel 20 is an organic light emitting diode (OLED) display panel or a micro OLED (Micro OLED) display panel.

Figure 7A:
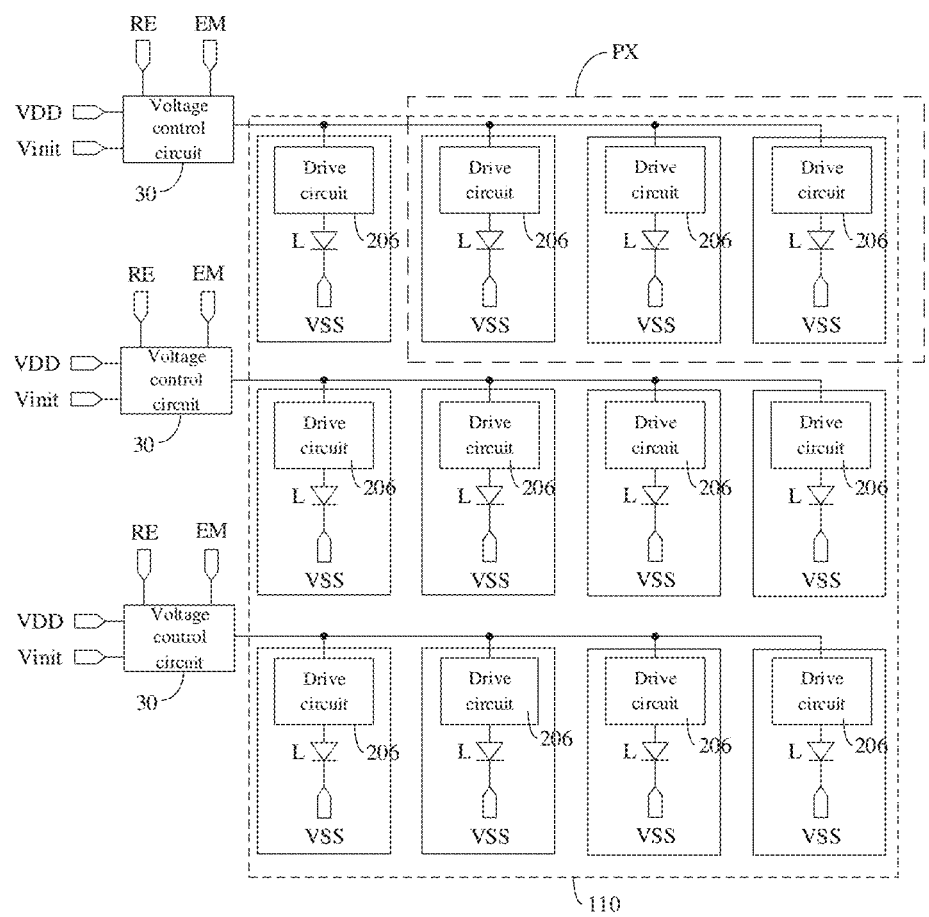
FIG. 7A is a schematic diagram of a drive circuit of a display panel provided by some embodiments of the present disclosure.

FIG. 7A is a schematic diagram of a drive circuit of a display panel provided by some embodiments of the present disclosure. A display panel includes a plurality of light emitting elements L (such as the above-described first light emitting elements 201 and second light emitting elements 202) in the display region 110 (AA region) and drive circuits 206 coupled to each light emitting element L in one-to-one correspondence. The drive circuit 206 includes a drive transistor and the drive transistor is configured to control the magnitude of the current used to drive a light emitting element to emit light. The display panel may further include a plurality of voltage control circuits 30 in the non-display region 120. For example, at least two of drive circuits 206 in a row can share one voltage control circuit 30, and a first electrode of a drive transistor in a row of drive circuits 206 is coupled to the shared voltage control circuit 30, and a second electrode of each drive transistor is coupled to a corresponding light emitting element L. The voltage control circuit 30 is configured to output an initialization signal Vinit to a first electrode of a drive transistor in response to a reset control signal RE so as to control the reset of a corresponding light emitting element L, and configured to output a first power supply signal VDD to a first electrode of a drive transistor in response to a light emission control signal EM so as to drive a light emitting element L to emit light. By sharing the voltage control circuit 30, the structure of each drive circuit in the display region 130 can be simplified, and the occupied area of the drive circuits in the display region 130 can be reduced, so that the display region 130 can be provided with more drive circuits and light emitting elements, and an organic light emitting display panel with high PPI can be realized. In addition, the voltage control circuit 30 outputs the initialization signal Vinit to the first electrode of the drive transistor under the control of the reset control signal RE so as to control the reset of the corresponding light emitting element, thereby avoiding the influence of the voltage applied to the light emitting element during the light emission of the previous frame on the light emission of the next frame, and further improving the afterimage phenomenon.

For example, the display panel may further include a plurality of pixel cells PX in the display region 110, and each pixel cell PX includes, for example, a plurality of sub-pixels. Each sub-pixel includes a light emitting element L and a drive circuit 206, respectively. Further, the pixel unit PX may include 3 sub-pixels of different colors. The three sub-pixels can emit white light respectively, and can emit full-color light in combination with the color film layer.

Figure 8A:
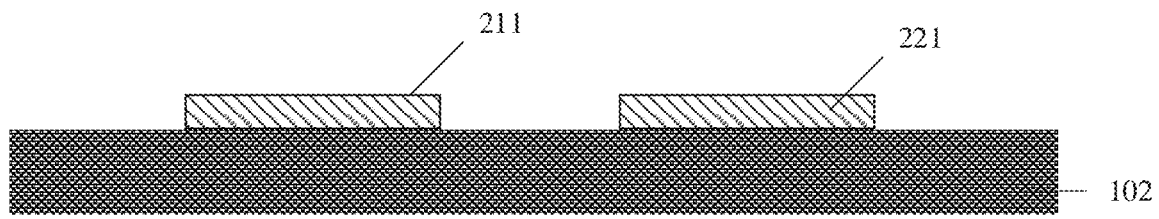
FIGS. 8A-8E are diagrams of steps of a method for manufacturing a display panel provided by some embodiments of the present disclosure.

For example, the drive circuits 206 in at least two adjacent subpixels in a same row may share one voltage control circuit 30. For example, in some examples, as illustrated in FIG. 8A, all drive circuits 206 in a same row may share one voltage control circuit 30. Alternatively, in other examples, the drive circuits 206 in two, three or more adjacent subpixels in a same row may share one voltage control circuit 30, which is not limitative herein. In this case, the occupied area of the drive circuits 206 in the display region 110 can be reduced by sharing the voltage control circuit 30.

Figure 7B:
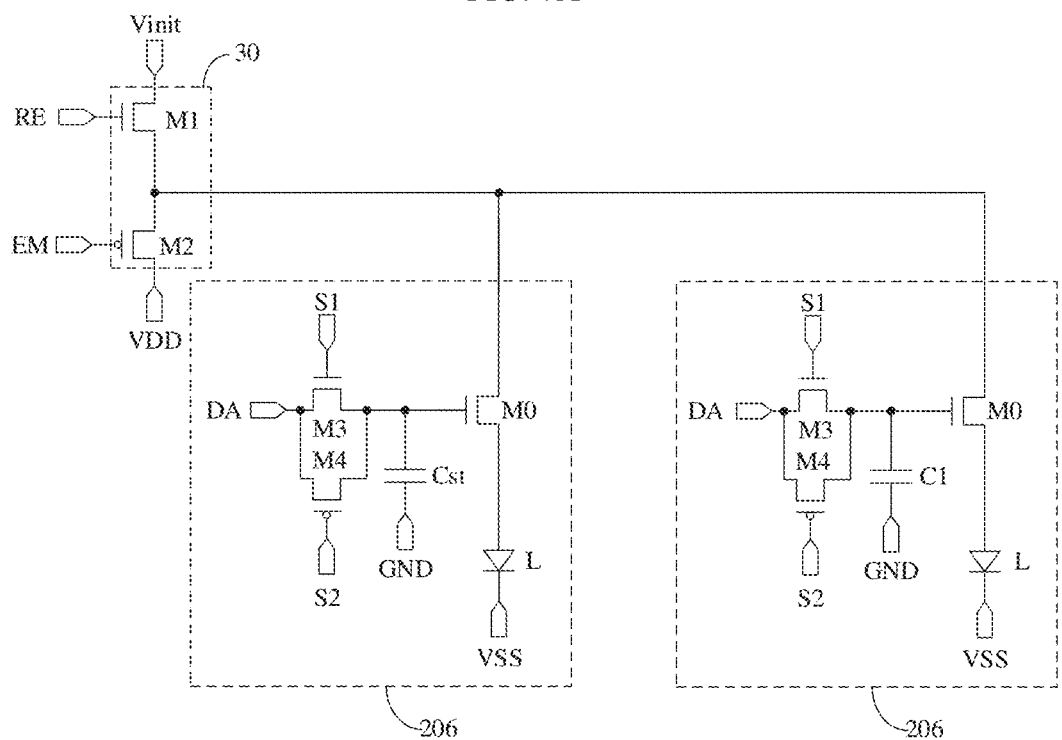
FIG. 7B is a circuit diagram of a specific implementation example of a voltage control circuit and a drive circuit of a display panel provided by some embodiments of the present disclosure.

FIG. 7B is a circuit diagram of a specific implementation example of a voltage control circuit and a drive circuit of a display panel provided by some embodiments of the present disclosure. For example, a drive transistor M0 in a drive circuit 206 is directly connected to a light emitting element L, and the light emitting element L may be, for example, the first transistor 203 or the second transistor 204 described above. A positive electrode of the light emitting element L is electrically connected to the drive transistor M0, and a negative electrode of the light emitting element L is electrically connected to a second power supply terminal VSS. The voltage of the second power supply terminal VSS is generally a negative voltage or a ground voltage VGND (generally 0V), and the voltage of the initialization signal Vinit may also be set to the ground voltage VGND, which is not limitative herein. For example, the light emitting element L may be set as a Micro-OLED or a Mini-OLED, which helps to realize an organic light emitting display panel with high PPI.

For example, taking two drive circuits 206 included in a row as an example, the voltage control circuit 30 may include a first switching transistor M1 and a second switching transistor M2. A gate electrode of the first switching transistor M1 is used for receiving a reset control signal RE, a first electrode of the first switching transistor M1 is used for receiving an initialization signal Vinit, and a second electrode of the first switching transistor M1 is coupled with a first electrode S of the corresponding drive transistor M0. A gate electrode of the second switching transistor M2 is used for receiving a light emission control signal EM, a first electrode of the second switching transistor M2 is used for receiving a first power supply signal VDD, and a second electrode of the second switching transistor M2 is coupled with a first electrode S of the corresponding drive transistor M0. For example, in other embodiments, a transistor may be connected in series between the first switching transistor M1 and the drive transistor M0 in order to reduce the load of the traces and improve the uniformity of pixel driving.

For example, the types of the first switching transistor M1 and the second switching transistor M2 may be different. For example, the first switching transistor M1 is an N-type transistor and the second switching transistor M2 is a P-type transistor. Alternatively, the first switching transistor M1 is a P-type transistor and the second switching transistor M2 is an N-type transistor. Of course, the first switching transistor M1 and the second switching transistor M2 may be of a same type. In actual application, the types of the first switching transistor M1 and the second switching transistor M2 need to be designed according to the actual application environment, which is not limitative herein.

For example, the drive circuit 206 may further include a third switching transistor M3 and a storage capacitor Cst. For example, a gate electrode of the third switching transistor M3 is used to receive a first gate scanning signal S1, a first electrode of the third switching transistor M3 is used to receive a data signal DA, and a second electrode of the third switching transistor M3 is coupled to a gate electrode G of the drive transistor M0. A first terminal of the storage capacitor Cst is coupled to the gate electrode G of the drive transistor M0, and a second terminal of the storage capacitor Cst is coupled to a ground terminal GND.

For example, the drive circuit 206 may further include a fourth switching transistor M4. For example, a gate electrode of the fourth switching transistor M4 is used to receive a second gate scanning signal S2, a first electrode of the fourth switching transistor M4 is used to receive a data signal DA, and a second electrode of the fourth switching transistor M4 is coupled to the gate electrode G of the drive transistor M0. Furthermore, the fourth switching transistor M4 and the third switching transistor M3 are of different types. For example, the third switching transistor M3 is an N-type transistor and the fourth switching transistor M4 is a P-type transistor. Alternatively, the third switching transistor M3 is a P-type transistor and the fourth switching transistor M4 is an N-type transistor.

It should be noted that in the case where the voltage of the data signal DA is a voltage corresponding to high gray scale, the fourth switching transistor M4, for example, of a P type is turned on so as to transmit the data signal DA to the gate electrode G of the drive transistor M0, so that the voltage of the data signal DA can be prevented from being influenced by the threshold voltage of the third switching transistor M3 for example, of a N type. In the case where the voltage of the data signal DA is a voltage corresponding to low gray scale, the third switching transistor M3, for example of the N type is turned on so as to transmit the data signal DA to the gate electrode G of the drive transistor M0, so that the voltage of the data signal DA can be prevented from being influenced by the threshold voltage of the fourth switching transistor M4, for example of the P type. This can expand the range of the voltage input to the gate electrode G of the drive transistor M0.

The embodiments of the present disclosure also provide an electronic device which includes the described display panel 20. For example, the electronic device is a product or component having any display function such as a digital photo frame, a smart bracelet, a smart watch, a mobile phone, a tablet computer, a display, a notebook computer, a navigator, etc.

The embodiments of the present disclosure also provide a method for manufacturing the described display panel, the manufacturing method at least includes: providing a substrate; forming a first conductive layer, an organic functional layer, and a second conductive layer on the substrate sequentially. The first conductive layer includes a first electrode and a second electrode respectively in a first sub-pixel region and a second sub-pixel region. The organic functional layer includes a charge generation layer, and the charge generation layer includes a first charge generation layer portion and a second charge generation layer portion respectively in the first sub-pixel region and the second sub-pixel region. The second conductive layer includes a third electrode and a fourth electrode respectively in the first sub-pixel region and the second sub-pixel region. The first electrode, the first charge generation layer portion, and the third electrode form a first light emitting element, and the second electrode, the second charge generation layer portion, and the fourth electrode form a second light emitting element so as to form a drive circuit. The drive circuit is electrically connected to the first light emitting element and the second light emitting element, and is configured to drive the first light emitting element and the second light emitting element. A spacer is formed between the first light emitting element and the second light emitting element. The drive circuit includes a transistor, and the transistor includes a semiconductor layer inside the substrate. The spacer disconnects the first charge generation layer portion and the second charge generation layer portion. The charge generation layer further includes a third charge generation layer portion, the third charge generation layer portion is between the spacer and the second conductive layer, and respectively disconnected from the first charge generation layer portion and the second charge generation layer portion.

For example, with reference to FIG. 2B, a silicon substrate can be used as the substrate, and a CMOS integrated circuit process can be used to form the drive circuit 206 on the silicon substrate 101, which may be referred to the description of FIG. 2B specifically, and is not repeated here. These processes can be completed, for example, by a wafer factory, and then the fabrication process of light emitting elements and the subsequent packaging process can be completed by a back-end panel factory on the substrate 102.

For convenience of explanation, a method for manufacturing a first light emitting element and a second light emitting element is mainly described below, and the substrate and the drive circuit are referred to as a drive substrate, the drive substrate is electrically connected to the first light emitting element and the second light emitting element and is configured to drive the first light emitting element and the second light emitting element to emit light.

FIGS. 8A-8E illustrate step diagrams of a method for manufacturing a display panel provided by some embodiments of the present disclosure.

As illustrated in FIG. 8A, a first conductive layer is formed on a drive substrate 102, and the first conductive layer is patterned to form a first electrode 211 and a second electrode 221 which are spaced.

For example, the material of the first conductive layer is a conductive material having a high work function so as to form an anode of the light emitting element, for example, the material includes metal, conductive oxide material. For example, the first conductive layer is a single-layer structure or a multi-layer structure.

Figure 8B:
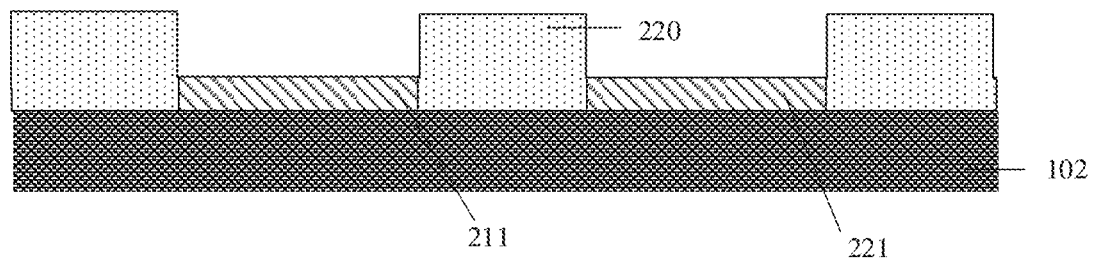

As illustrated in FIG. 8B, a spacer material layer is formed on the first conductive layer, and the spacer material layer is patterned to form a spacer 220 between the first electrode 211 and the second electrode 221.

For example, the cross section of the spacer in a direction perpendicular to the substrate is positive trapezoidal, rectangular, or inverted trapezoidal.

For example, the angle between a side surface and a top surface of the spacer 220 is less than 100°.

The material of the spacer material layer is an insulating material, such as an organic insulating material or an inorganic insulating material.

In some examples, the spacer 220 may be formed using an inorganic insulating material in combination with a dry etching process. For example, the material of the spacer 220 is silicon nitride, oxide or oxynitride. As illustrated in FIG. 8B, the cross section of the spacer 220 is approximately rectangular. This is because the dry etching process has good anisotropy, and almost no lateral drilling occurs in the etching process, thus a pattern having a cross section that is close to a rectangle can be obtained.

Figure 8C:
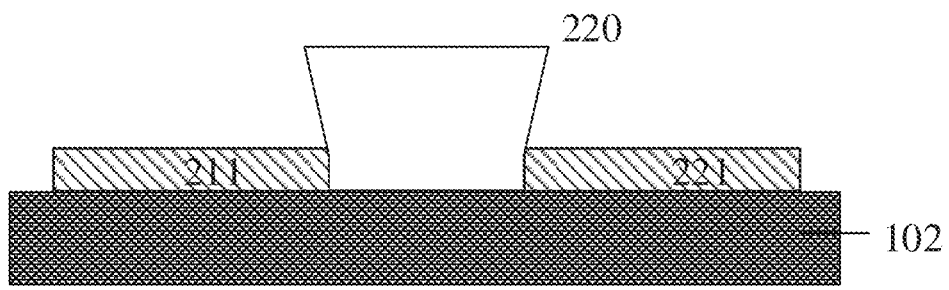

In other examples, the spacer 220 may be formed using a negative photoresist material. As illustrated in FIG. 8C, the cross section of the spacer 220 is inverted trapezoidal. This is because in the exposure process, the closer the negative photoresist is to the substrate 20, the lower the sensitivity, thus the spacer 220 having small bottom area and large top area can be obtained after development.

For example, in a direction perpendicular to the substrate 101 and with a surface of the first conductive layer 301 that is away from the drive substrate 102 as a reference surface, the height of the spacer 220 ranges from 125 nm to 175 nm.

Figure 8D:
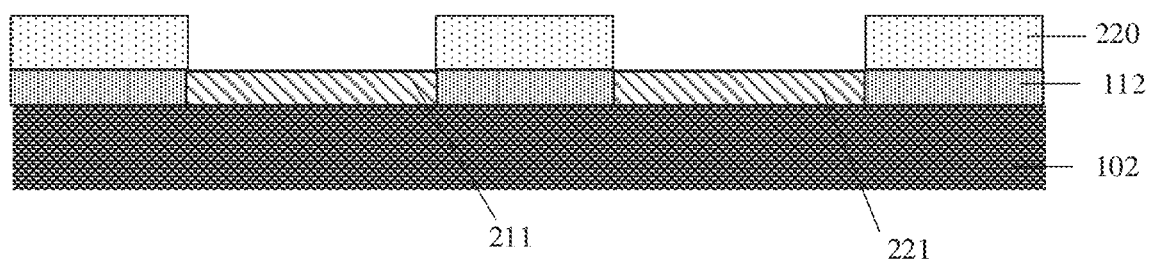

In still other examples, as illustrated in FIG. 8D, an isolation layer 112 may be formed first, and the isolation layer 112 is filled between the first electrode 211 and the second electrode 221 and has a surface flush with the first conductive layer. Then, the spacer 220 is formed on the isolation layer 112. This manner helps the spacer 220 to form a flat surface and helps the second conductive layer 303 to form a continuous layer structure, subsequently.

For example, the material of the isolation layer 112 is an inorganic insulating material, such as silicon nitride, silicon oxide, or silicon oxynitride.

For example, the isolation layer 112 is polished by a mechanical polishing process so that a surface of the isolation layer 112 is flush with the first conductive layer. The etching of the first conductive layer by the photolithography process can be avoided by adopting the mechanical polishing process.

Figure 8E:
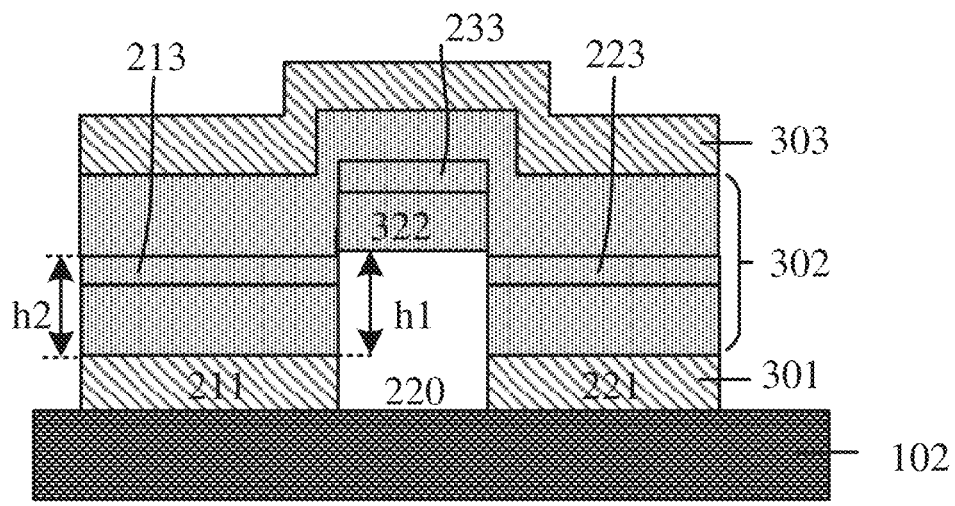

As illustrated in FIG. 8E, an organic functional layer 302 is formed on the first conductive layer 301. The organic functional layer 302 may be formed on the whole surface by, for example, the open mask combined with the evaporation process, and includes a charge generation layer 321.

For example, the organic functional layer 302 further includes at least two light emitting layers connected in series by the charge generation layer 321, and may further include an electron/hole transport layer, an electron/hole injection layer, an electron/hole blocking layer, etc. as required, which is not repeated here. Because the thermal evaporation energy is small in the evaporation process of organic materials, it is difficult for organic materials to be continuously deposited at a side wall of the spacer 220 which has a large slope, so that the charge generation layer 321 is disconnected at the spacer 220 and the spacer 220 is exposed, thereby forming a first charge generation layer portion 213, a second charge generation layer portion 223, and a third charge generation layer portion 233 which are disconnected from each other in a first sub-pixel region, a second sub-pixel region, and on the spacers 220, respectively. In a direction perpendicular to the drive substrate 102, and with a surface of the first conductive layer 301 that is away from the drive substrate 102 as a reference surface, the ratio h1/h2 of the height h1 of the spacer 220 to the height h2 of the portion of the charge generation layer 321 that is in the sub-pixel regions ranges from 0.7 to 2.5.

For example, the thickness of the organic functional layer 302 ranges from 200 nm to 350 nm. For example, with a surface of the first conductive layer 301 that is away from the drive substrate 102 as a reference surface, the height of the first charge generation layer portion 213 or the second charge generation layer portion 223 in a direction perpendicular to the drive substrate 102 ranges from 70 nm to 170 nm.

In this process, no additional patterning process is required for the charge generation layer 321 or the organic functional layer 302, thus the resolution of the display device is not limited by the accuracy of the mask plate. In another aspect, because the spacer 220 is formed before the organic functional layer, the patterning process (e.g., yellow light process) for forming the spacer 220 does not adversely affect the performance of the organic functional layer.

A second conductive layer 303 is then formed on the organic functional layer 302 so as to form a third electrode and a fourth electrode in the first sub-pixel region and the second sub-pixel region, respectively. The third electrode and the fourth electrode are an integrated structure connected to each other.

For example, the material of the second conductive layer 303 is a conductive material having low work function and high transmittance. For example, it may be a transparent metal oxide conductive material, such as indium zinc oxide (IZO), indium tin oxide (ITO), indium gallium zinc oxide (IGZO), etc., or it may be a transparent nano conductive material such as carbon nanotubes, graphene, nano silver wires, etc.

The transparent conductive layer 303 can effectively cover the spacer 220 to form a continuous conductive structure because the conductive material has better ductility and step coverage.

For example, in order to prevent the second conductive layer 303 from being disconnected because of the arrangement of the spacer 220, the thickness of the second conductive layer 303 may be greater than 100 nanometers. In the case where the second conductive layer 303 is a transparent conductive layer, the thickness has little influence on the light transmittance of the transparent conductive layer, because the transparent conductive layer means that the light transmittance is very high.

Figure 9:
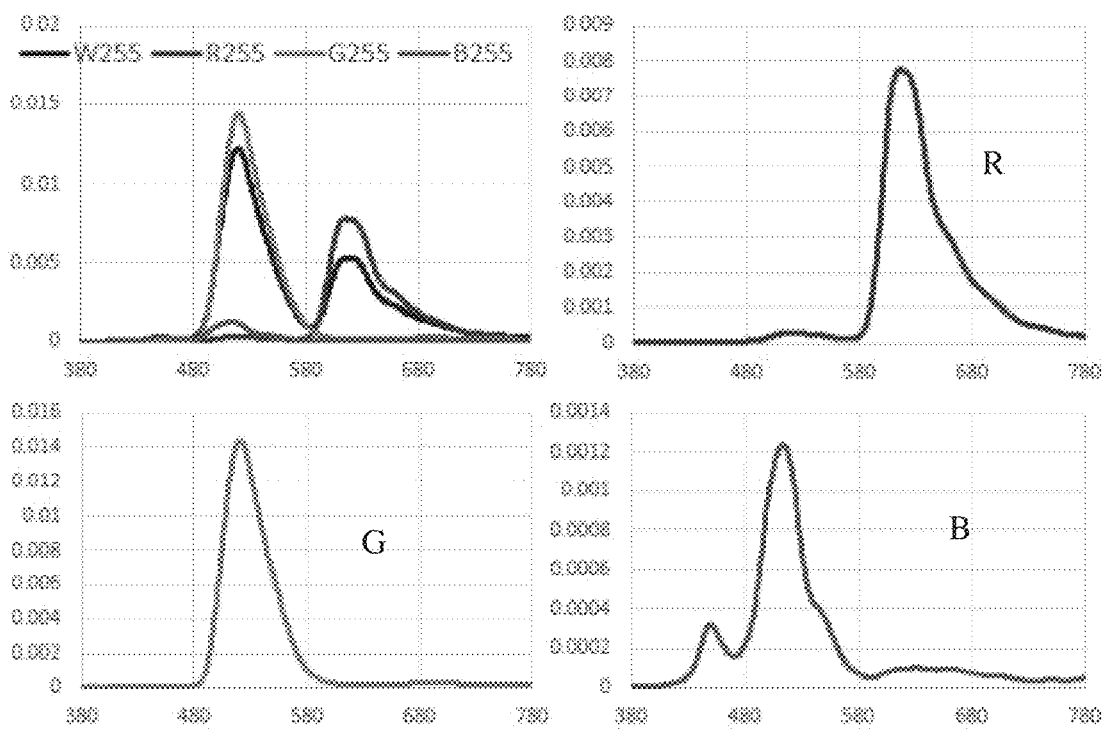
FIG. 9 is a spectral diagram of a display panel provided by some embodiments of the present disclosure.

FIG. 9 illustrates spectral diagrams of a display panel provided by at least one embodiment of the present disclosure, and a spectral diagram in which three sub-pixels (red (R), green (G), and blue (B)) are simultaneously lit and three spectral diagrams in which the three sub-pixels are respectively lit are illustrated in FIG. 9.

With reference to FIG. 1C, as illustrated in FIG. 9, in the case where the three sub-pixels are respectively lit, light of other colors is well suppressed, the color coordinates of the three sub-pixels are greatly improved, and the color gamut of the display device formed by the display panel can reach more than 80%.

The above descriptions are merely exemplary implementations of the present disclosure and are not intended to limit the scope of the present disclosure, which is defined by the accompanying claims.

What is claimed is:

1. A display panel, comprising a first sub-pixel region and a second sub-pixel region which are adjacent to each other, wherein the display panel comprises a substrate and a first conductive layer, an organic functional layer, and a second conductive layer which are sequentially on the substrate, and the organic functional layer comprises a charge generation layer, the first conductive layer comprises a first electrode and a second electrode which are insulated from each other and in the first sub-pixel region and the second sub-pixel region respectively, the charge generation layer comprises a first charge generation layer portion and a second charge generation layer portion which are in the first sub-pixel region and the second sub-pixel region respectively, the second conductive layer comprises a third electrode and a fourth electrode which are coupled to each other and in the first sub-pixel region and the second sub-pixel region respectively, and the third electrode and the fourth electrode are an integrated structure, the first electrode, the first charge generation layer portion, and the third electrode form a first light emitting element, and the second electrode, the second charge generation layer portion and the fourth electrode form a second light emitting element, the display panel further comprises a spacer between the first light emitting element and the second light emitting element, and the spacer disconnects the first charge generation layer portion and the second charge generation layer portion, the charge generation layer further comprises a third charge generation layer portion, the third charge generation layer portion is between the spacer and the second conductive layer, and the third charge generation layer portion is disconnected from the first charge generation layer portion and the second charge generation layer portion respectively, and the display panel further comprises a drive circuit, the drive circuit is electrically coupled to the first light emitting element and the second light emitting element and configured to drive the first light emitting element and the second light emitting element, and the drive circuit comprises a transistor and the transistor comprises a semiconductor layer which is inside the substrate.

2. The display panel according to claim 1, wherein, in a direction perpendicular to the substrate, with a surface of the first conductive layer which is away from the substrate as a reference surface, a ratio of a height of the spacer to a height of the first charge generation layer portion or the second charge generation layer portion ranges from 0.7 to 2.5.

3. The display panel according to claim 1, wherein, in a direction perpendicular to the substrate, with a surface of the first conductive layer which is away from the substrate as a reference surface, a height of the spacer ranges from 125 nm to 175 nm, and a height of the first charge generation layer portion or the second charge generation layer portion ranges from 70 nm to 170 nm.

4. The display panel according to 1, wherein an average thickness of the organic functional layer ranges from 200 nm to 350 nm.

5. The display panel according to wherein an angle between a side surface and a top surface of the spacer is less than 100°.

6. The display panel according to 1, wherein a thickness of the organic functional layer at a center of the first sub-pixel region or the second sub-pixel region in a direction pointing to the spacer becomes thinner.

7. The display panel according to claim 1, wherein the first light emitting element and the second light emitting element are configured to emit white light, respectively.

8. The display panel according to claim 1, wherein the organic functional layer further comprises a plurality of light emitting layers which are stacked in a direction perpendicular to the substrate.

9. The display panel according to claim 8, wherein at least two light emitting layers of the plurality of light emitting layers are coupled in series with each other, and the charge generation layer is between two adjacent light emitting layers of the at least two light emitting layers.

10. The display panel according to claim 9, wherein the plurality of light emitting layers comprise a red-green light emitting layer and a blue light layer, the red-green light emitting layer and the blue light layer are coupled in series with each other, and the charge generation layer is between the red-green light emitting layer and the blue light layer.

11. The display panel according to claim 10, wherein the red-green light emitting layer comprises a red light layer and a green light layer which are adjacent to each other, and among them, the red light layer is closer to the first conductive layer.

12. The display panel according to claim 1, wherein the charge generation layer comprises a N-type charge generation layer and a P-type charge generation layer which are stacked.

13. The display panel according to claim 12, wherein the organic functional layer further comprises an electron transport layer and a hole transport layer which are on both sides of the charge generation layer, respectively; and the N-type charge generation layer is closer to the electron transport layer, and the P-type charge generation layer is closer to the hole transport layer.

14. The display panel according to claim 13, wherein the second conductive layer is a cathode layer, and the hole transport layer is between the charge generation layer and the second conductive layer; and the hole transport layer continuously covers the first sub-pixel region, the second sub-pixel region, and the spacer between the first sub-pixel region and the second sub-pixel region.

15. The display panel according to claim 1, further comprising a third light emitting element in a third sub-pixel region, wherein the first light emitting element, the second light emitting element, and the third light emitting element form a pixel cell.

16. The display panel according to claim 1, further comprising a color film layer, wherein the color film layer is on a side of the first light emitting element and the second light emitting element which is away from the substrate.

17. The display panel according to claim 1, wherein the charge generation layer is a material layer which has a highest conductivity in the organic functional layer.

18. A method for manufacturing a display panel, the display panel comprising a first sub-pixel region and a second sub-pixel region which are adjacent to each other, and the method comprising:

providing a substrate, forming a drive circuit, forming a first conductive layer, an organic functional layer, and a second conductive layer on the substrate sequentially, wherein the first conductive layer comprises a first electrode and a second electrode which are insulated from each other and in the first sub-pixel region and the second sub-pixel region respectively, the organic functional layer comprises a charge generation layer, the charge generation layer comprises a first charge generation layer portion and a second charge generation layer portion which are in the first sub-pixel region and the second sub-pixel region respectively, the second conductive layer comprises a third electrode and a fourth electrode which are coupled to each other and in the first sub-pixel region and the second sub-pixel region respectively, and the third electrode and the fourth electrode are an integrated structure, the first electrode, the first charge generation layer portion, and the third electrode form a first light emitting element, and the second electrode, the second charge generation layer portion, and the fourth electrode form a second light emitting element, and forming a spacer between the first light emitting element and the second light emitting element, wherein the drive circuit is electrically coupled to the first light emitting element and the second light emitting element and configured to drive the first light emitting element and the second light emitting element, the drive circuit comprises a transistor and the transistor comprises a semiconductor layer which is inside the substrate, the spacer disconnects the first charge generation layer portion and the second charge generation layer portion, and the organic functional layer further comprises a third charge generation layer portion, the third charge generation layer portion is between the spacer and the second conductive layer, and the third charge generation layer portion is disconnected from the first charge generation layer portion and the second charge generation layer portion, respectively.

19. The method according to claim 18, wherein, in a direction perpendicular to the substrate, with a surface of the first conductive layer which is away from the substrate as a reference surface, a ratio of a height of the spacer to a height of the first charge generation layer portion or the second charge generation layer portion ranges from 0.7 to 2.5.

20. The method according to claim 18, wherein, in a direction perpendicular to the substrate, with a surface of the first conductive layer which is away from the substrate as a reference surface, a height of the spacer ranges from 125 nm to 175 nm, and a height of the first charge generation layer portion or the second charge generation layer portion ranges from 70 nm to 170 nm.

* * * * *